United States Patent [19]
Yamazaki

[11] Patent Number: 6,072,724
[45] Date of Patent: Jun. 6, 2000

[54] SEMICONDUCTOR INTEGRATED CIRCUIT FOR GENERATING PLURALITY OF DIFFERENT REFERENCE LEVELS

[75] Inventor: Hirokazu Yamazaki, Kawasaki, Japan

[73] Assignee: Fujitsu Limited, Kawasaki, Japan

[21] Appl. No.: 08/902,275

[22] Filed: Jul. 29, 1997

[30] Foreign Application Priority Data

Mar. 18, 1997 [JP] Japan ..................................... 9-064611

[51] Int. Cl.$^7$ ................................................. G11C 16/06
[52] U.S. Cl. .............................. 365/185.21; 365/185.33; 365/185.2
[58] Field of Search ...................... 365/185.21, 185.24, 365/185.33, 185.17, 185.2

[56] References Cited

U.S. PATENT DOCUMENTS

| | | | |
|---|---|---|---|
| 4,761,765 | 8/1988 | Hashimoto | 365/185.21 |
| 5,386,388 | 1/1995 | Atwood et al. | 365/185.21 |
| 5,477,495 | 12/1995 | Tanaka et al. | 365/185.17 |
| 5,608,669 | 3/1997 | Mi et al. | 365/185.21 |
| 5,629,892 | 5/1997 | Tang | 365/185.21 |
| 5,684,739 | 11/1997 | Takeuchi | 365/185.21 |

*Primary Examiner*—Trong Phan
*Attorney, Agent, or Firm*—Arent Fox Kintiner Plotkin & Kahn PLLC

[57] ABSTRACT

Disclosed is an art making it possible that, in a reference cell circuit for outputting a plurality of different reference level signals, even if the number of transistors serving as reference cells and each having a floating gate increases, the time required for setting channel currents of the transistors will not increase. The floating gates of a plurality of transistors for generating different reference signal levels are connected in common so that the channel currents of all the transistors can be set simultaneously. The transistors have the channel lengths thereof, channel widths thereof, or both of them made different. The channel currents of the transistors are therefore mutually different. An error in all reference levels dependent on a manufacturing process is compensated for by adjusting an amount of charge to be injected into the floating gates.

16 Claims, 7 Drawing Sheets

SEMICONDUCTOR INTEGRATED CIRCUIT FOR GENERATING PLURALITY OF DIFFERENT REFERENCE LEVELS

BACKGROUND OF THE INVENTION

1. Field of the Invention

The present invention relates to a semiconductor integrated circuit including a reference circuit composed of transistors, each having a floating gate, which are used to form a sense amplifier having different threshold levels. More particularly, this invention is concerned with a flash memory requiring many reference levels for realizing complex functions.

2. Description of the Related Art

As far as flash memories are concerned, high circuit integration is facilitated due to the introduction of microscopic cells but this means that it is becoming more difficult to guarantee the reliability of the data. A plurality of reference levels, that change little from one another, are set so that reliability can be guaranteed through each of verification after writing (changing a logical state from 1 to 0) and verification after erasure (changing a logical state from 0 to 1). The reference levels are selected according to the operation to be performed.

A sense amplifier is widely adopted in order to read data not only from a flash memory but also from a memory cell. Sense amplifiers are broadly divided into two types, that is, a type of identifying data of 0 or 1 using a level set in a sense amplifier itself as a reference, and a type of identifying data by comparing it with the contents of a reference cell for generating a reference. The type in which a level is set in a sense amplifier is adopted when the level representing 0 and the level representing 1 are fully separated from each other and all that is required is to identify the level representing 0 or 1. In contrast, the type in which a reference cell is used to produce a reference has the advantage that any level can be generated by adjusting a level set in the reference cell, though the circuitry is complex and the manufacturing process is complex because the reference cell must be brought to a given state. At present, the type in which a reference cell is used has become the most popular. In particular, when a plurality of reference levels must be set as mentioned above, a type in which reference cells having a plurality of different levels set therein are used is adopted. A plurality of reference cells associated with reading, writing verification, and erasure verification are included.

A plurality of reference cells are required to have the currents flowing along channels thereof set to different given values. For differentiating the channel currents, various methods are available. In the past, a transistor having a floating gate was used to form a reference cell as it is used to form a memory cell included in a flash memory. An amount of charge to be injected into the floating gate is set in the testing stage in the process of manufacturing, whereby the channel current of the reference cell is adjusted to have a given value exactly. With regard to the injection of charge into the floating gate, injection of charge and measurement of a channel current are carried out repeatedly, the same number of times as the number of transistors, in the testing stage in the process of manufacturing. Thus, the channel currents of the transistors are set to given values.

In a known reference cell circuit, the same number of transistors as the number of reference levels are included independently, and the channel currents of the transistors are set independently. For setting the channel currents, it is necessary to carry out injection of charge and measurement of a channel current repeatedly the same number of times as the number of transistors. This poses a problem in that much time is required for testing and the cost increases.

In recent years, flash memory, and the like, has been required to attain more precise control in line with higher circuit integration and the number of reference levels has tended to increase. Moreover, one memory cell has stored data of one bit in the past. Studies have been made on storage of multivalued data in one memory cell. If the occasion arises, the number of reference levels would increase markedly. This being the case, when the number of reference cells is increased and the cells must be set to given channel currents, a great increase in testing time is predicted.

SUMMARY OF THE INVENTION

An object of the present invention is to make it possible that even if the number of transistors each having a floating gate and serving as a reference cell, which are included in a reference cell circuit, increases, the time required for setting the channel currents of the transistors does not increase.

In a semiconductor integrated circuit of the present invention, for accomplishing the above object, the floating gates of a plurality of transistors for generating different reference signal levels are connected in common so that the channel currents of all the transistors can be set simultaneously. The transistors have the lengths of the channels thereof, the widths thereof, or both made different, whereby the channel currents are made mutually different. An error in all reference levels is dependent on the manufacturing process and is compensated for by adjusting an amount of charge to be injected into the floating gates.

When charge is injected into the floating gates, the channel current of any of the transistors is measured. A monitoring circuit is therefore included for outputting one of the signal levels of the plurality of transistors to an electrode pad. Moreover, a charge adjustment transistor may be included separately for injecting charge into the floating gates or drawing charge out of the floating gates. The charge adjustment transistor also has a floating gate that is connected to the floating gates of the other transistors serving as reference cells. In this case, the monitoring circuit is designed to output the signal level of the charge adjustment transistor to the electrode pad.

It has been known in the past that the channel current of a transistor varies depending on the channel length thereof. The present inventor has discovered that when the floating gates of transistors are connected in common, if an amount of charge to be injected into the floating gates is changed, the channel currents of the transistors vary with the relationship of a channel current being proportional to a channel length being retained. In the process of manufacturing, the channel lengths of the transistors are determined accurately on the basis of the ratio of the channel currents. An error in channel currents dependent on a manufacturing process is then compensated for by adjusting an amount of charge to be injected into the floating gates. Thus, the channel currents of the transistors can be set accurately.

In a semiconductor integrated circuit of the present invention, the ratio of channel currents of transistors serving as reference cells is determined on the basis of the channel lengths of the transistors. Since a difference in channel currents dependent on a manufacturing process is compensated for by injecting charge into floating gates connected in common, the channel currents can be set accurately. Moreover, adjustment in which injection of charge into floating gates and measurement of a channel current are carried out should merely be performed on one transistor alone. At the same time, the other transistors are adjusted. The time required for testing is therefore reduced drastically. Since the adjustment in which injection of charge into floating gates and measurement of a channel current are carried out should merely be performed on one transistor alone, only one control circuit and one monitoring circuit are needed. This leads to space saving. Eventually, the area of a chip can be reduced. The reduction in testing time and in chip area lead to a reduction in manufacturing cost.

The channel current of a transistor varies depending on the channel width. The ratio of channel currents of transistors serving as reference cells may therefore be set on the basis of the channel widths thereof. A difference in channel currents dependent on a manufacturing process may be compensated for by injecting charge into floating gates connected in common. Alternatively, the ratio of the channel currents of the transistors may be set on the basis of both the channel lengths and channel widths thereof.

BRIEF DESCRIPTION OF THE DRAWINGS

The invention will be more clearly understood from the description as set below with reference to the accompanying drawings, wherein.

DESCRIPTION OF THE PREFERRED EMBODIMENTS

An embodiment in which the present invention is adapted to a flash memory will be described below. However, the present invention is not limited to the flash memory but can apply to any semiconductor integrated circuit as long as the semiconductor integrated circuit has a circuit for generating different reference signal levels.

Before proceeding to a detailed description of the preferred embodiments of the present invention, a prior art flash memory and a prior art sense amplifier including a circuit which generates a plurality of reference levels will be described with reference to the accompanying drawings relating thereto for a clearer understanding of the differences between the prior art and the present invention.

Figure 1:
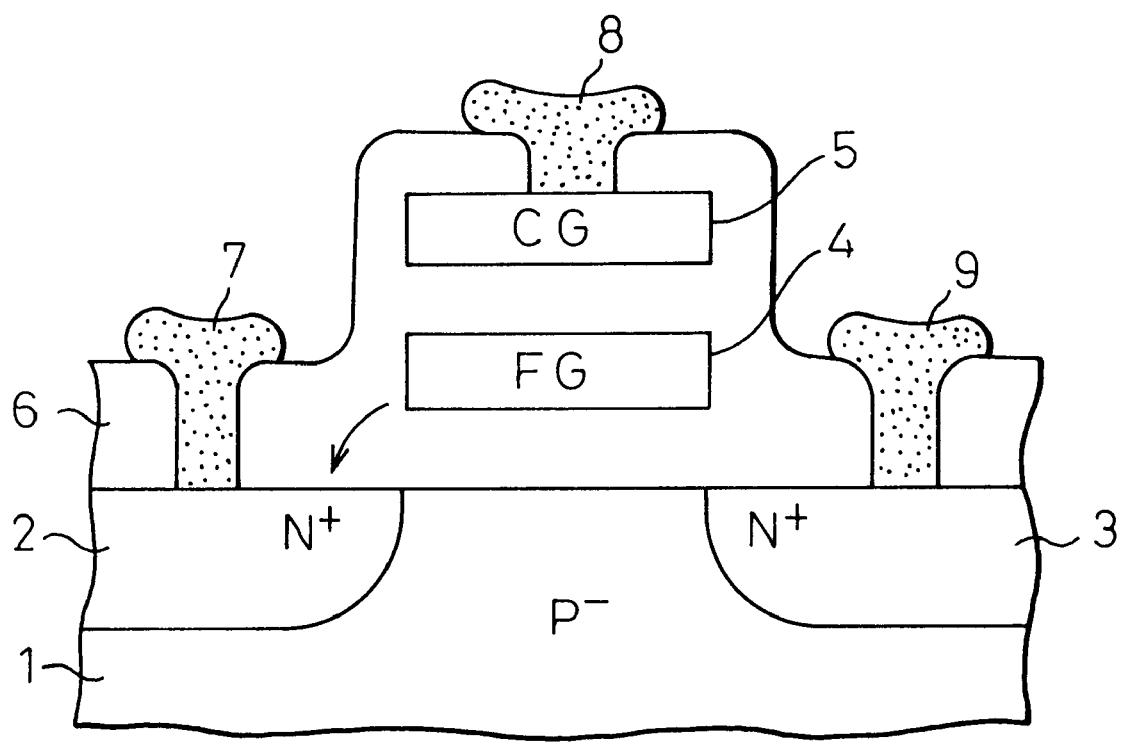
FIG. 1 is a diagram showing the basic structure of a memory cell in a flash memory.

FIG. 1 is a diagram showing the structure of a memory cell in a flash memory. As illustrated, the structure of a transistor serving as a memory cell is such that n-type diffusion regions 2 and 3 are formed in a p-type substrate 1 with a certain gap between them, and a floating gate (FG) 4 and control gate (CG) 5 are formed above the p-type substrate 1 and enclosed with an oxide film 6. A source electrode 7 and drain electrode 9 are connected with the n-type diffusion regions 2 and 3 respectively. A gate electrode 8 is connected with the control gate 5. Thus, the flash memory has a two-layered structure of a control gate and a floating gate. Information is stored by utilizing the fact that the channel current of a transistor serving as a memory cell varies depending on an amount of charge in the floating gate thereof. For example, when a memory cell is formed with an n-channel transistor, if electrons are injected into the floating gate of the transistor, the channel current of the transistor decreases. If no electron is injected, the channel current increases. Therefore, a positive voltage is applied to the gate electrode of the transistor and a positive low voltage is applied to the drain electrode thereof. The state in which the transistor conducts when the source electrode of the transistor is grounded is associated with a logical 0, and the state in which the transistor is nonconducting is associated with a logical 1.

For bringing the transistor to the state of the logical 1 by injecting charge into the floating gate of the transistor, a high voltage is applied to the gate electrode thereof, a positive voltage is applied to the drain electrode thereof, and the source electrode thereof is grounded. For erasing states stored, after charge is injected into the floating gates of all cells, the gate electrodes of transistors serving as the cells are grounded, the drain electrodes thereof are floated, and a high voltage is applied to the source electrodes thereof. The charge is then drawn out of the floating gates. As for an erasing method, there is a method in which a negative voltage is applied to the gate electrodes.

Figure 2:
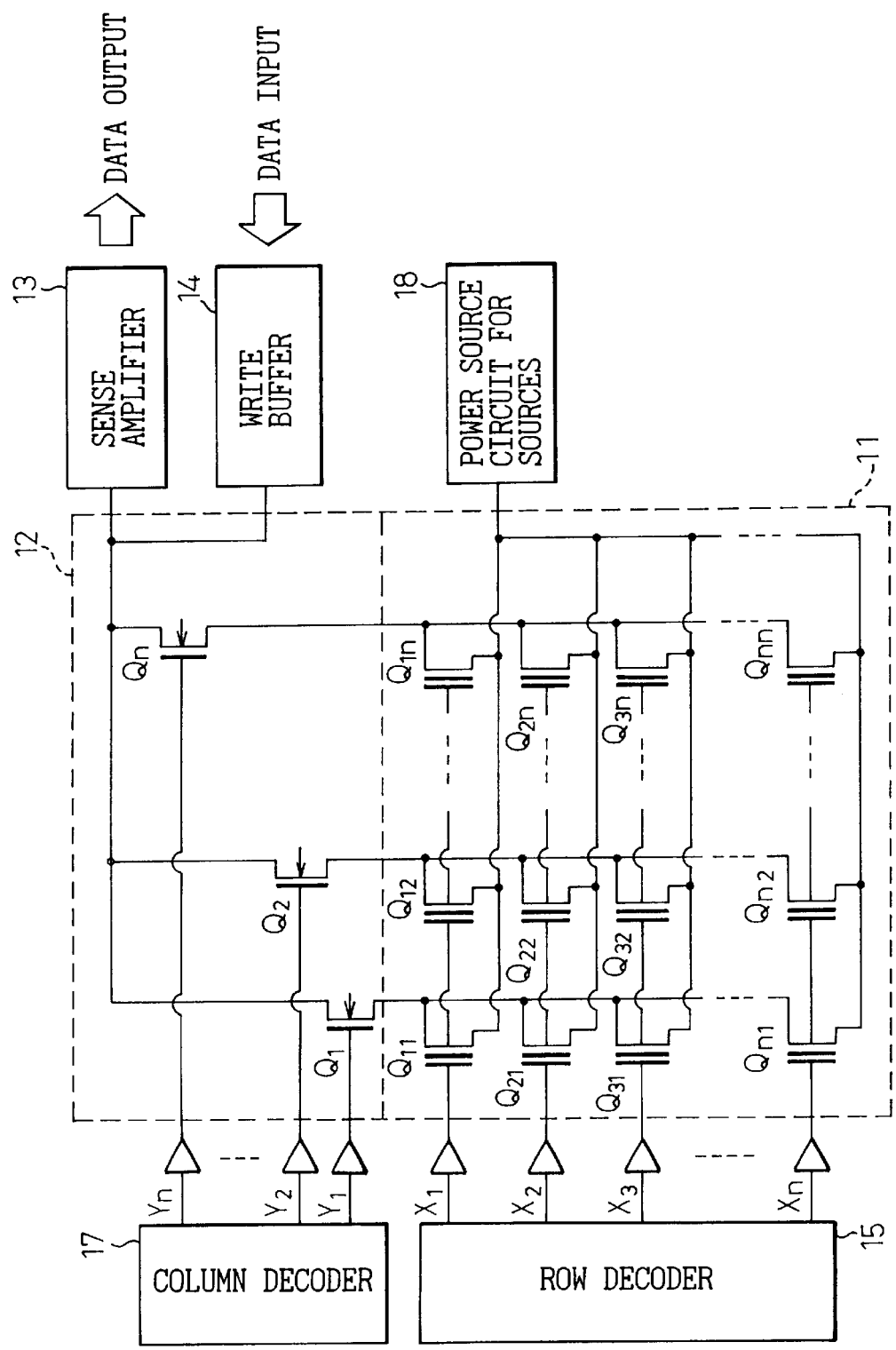
FIG. 2 is a diagram showing the overall configuration of a flash memory.

FIG. 2 is a diagram showing a cell block 11 in a flash memory composed of memory cells, each having the structure shown in FIG. 1, and peripheral circuits. In FIG. 2, a Y gate selection circuit 12 is composed of n-channel FETs. A column address signal sent from a column decoder 17 is applied to the gate of each transistor. The one cell block 11 is composed of memory cells each having the structure shown in FIG. 1. A row address signal sent from a row decoder is applied to each of the gates of the transistors laid out in a row direction by way of a word line. The drains of the transistors laid out in a column direction are connected to transistors in the Y gate selection circuit by way of bit lines, and the sources thereof are connected to a power source circuit for sources 18. A sense amplifier 13 and write buffer 14 are connected to the drains of the transistors included in the Y gate selection circuit 12. In the flash memory having these components, for writing, when a row address and column address are selected, data read from the write buffer is written in one transistor within the cell block. For reading, when a row address and column address are selected in the same manner, one transistor within the cell block is connected to the sense amplifier. Depending on the connected state, an output of the sense amplifier varies. Furthermore, for erasure, row address signals output from the row decoder 15 are all set to a zero level. A high voltage is applied from the power source circuit for sources 18 to the sources of all the memory cells, whereby data in all the memory cells within the cell block is erased. After writing or erasure, verification, in which processed data is read and checked, is carried out in order to see if the writing or erasure has been achieved normally.

Figure 3:
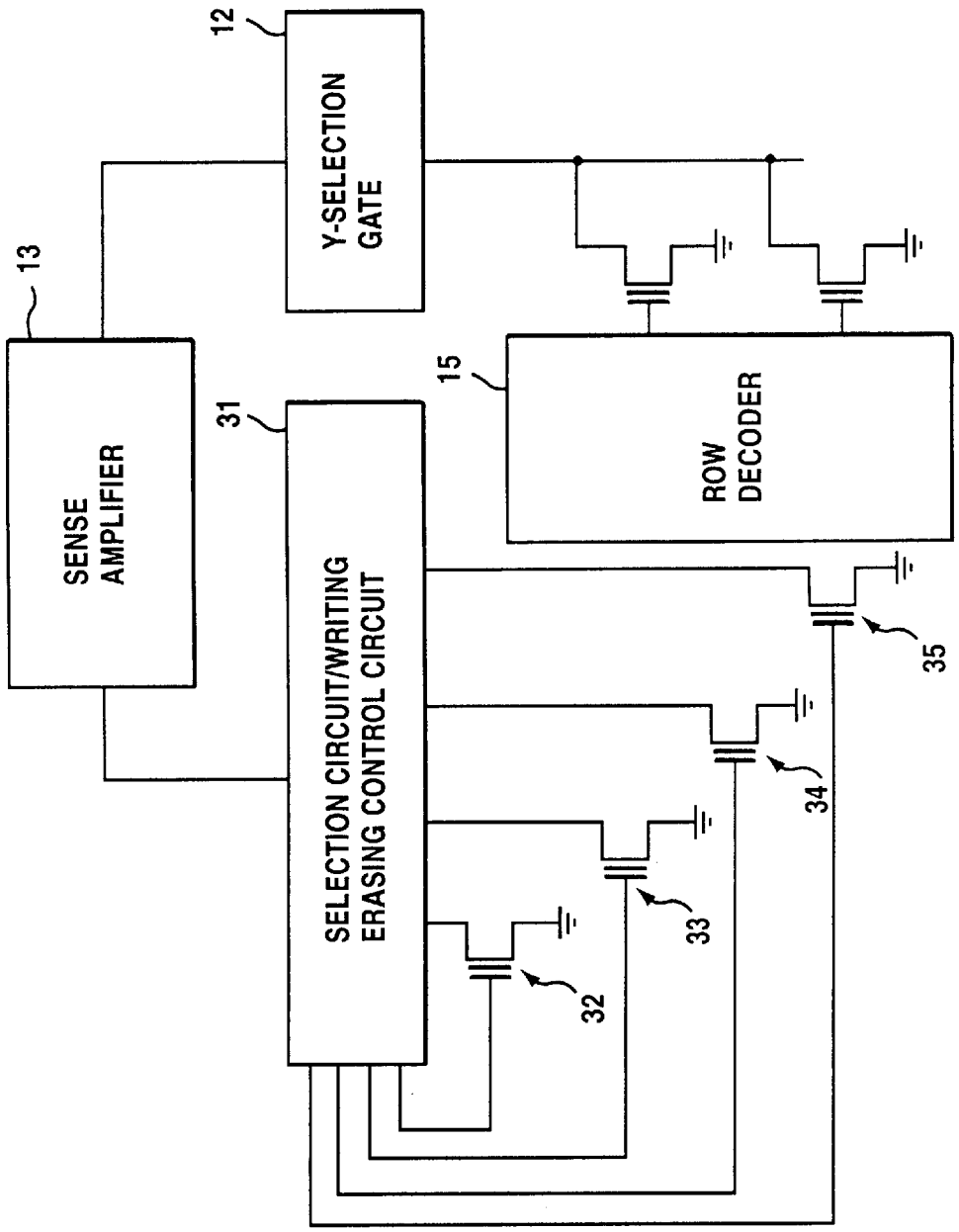
FIG. 3 is a diagram showing the configuration of a known reference cell circuit.

In the flash memory, a plurality of reference levels that change little from one another are set so that reliability can be guaranteed through each of after-writing verification and after-erasure verification. Accordingly, a plurality of reference cells associated with reading, writing verification, and erasure verification are included. FIG. 3 is a circuit diagram showing an example of a known reference cell circuit. A plurality of nonvolatile transistors 32 to 35 having different channel currents are included independently. A selection circuit/writing erasing control circuit 31 connects any of the transistors to the sense amplifier 13 according to an operation, and thus the sense amplifier uses an output of the selected transistor as a reference for comparison. The non-volatile transistors 32 to 35 have the same floating gate as the memory cell shown in FIG. 1. Depending on an amount of charge injected into a floating gate, a channel current varies. In injecting charge into a floating gate, injection of charge and measurement of a channel current are carried out repeatedly the same number of times as the number of transistors on the testing stage in the process of manufacturing. Thus, the channel currents are set to given values. The selection circuit/writing erasing control circuit 31 has the ability to output the current flowing in a selected transistor, directly or after being amplified, to an electrode pad in a channel current setting mode for reference cells. The probe of an external measuring instrument is brought into contact with the electrode pad in order to measure the channel current.

As shown in FIG. 3, in the known reference cell circuit, the same number of transistors as the number of reference levels are included independently, and the channel currents of the transistors are set separately. For setting the channel currents, injection of charge and measurement of a channel current must be carried out repeatedly by the same number of times as the number of transistors. This leads to an increase in testing time and in cost.

Figure 4:
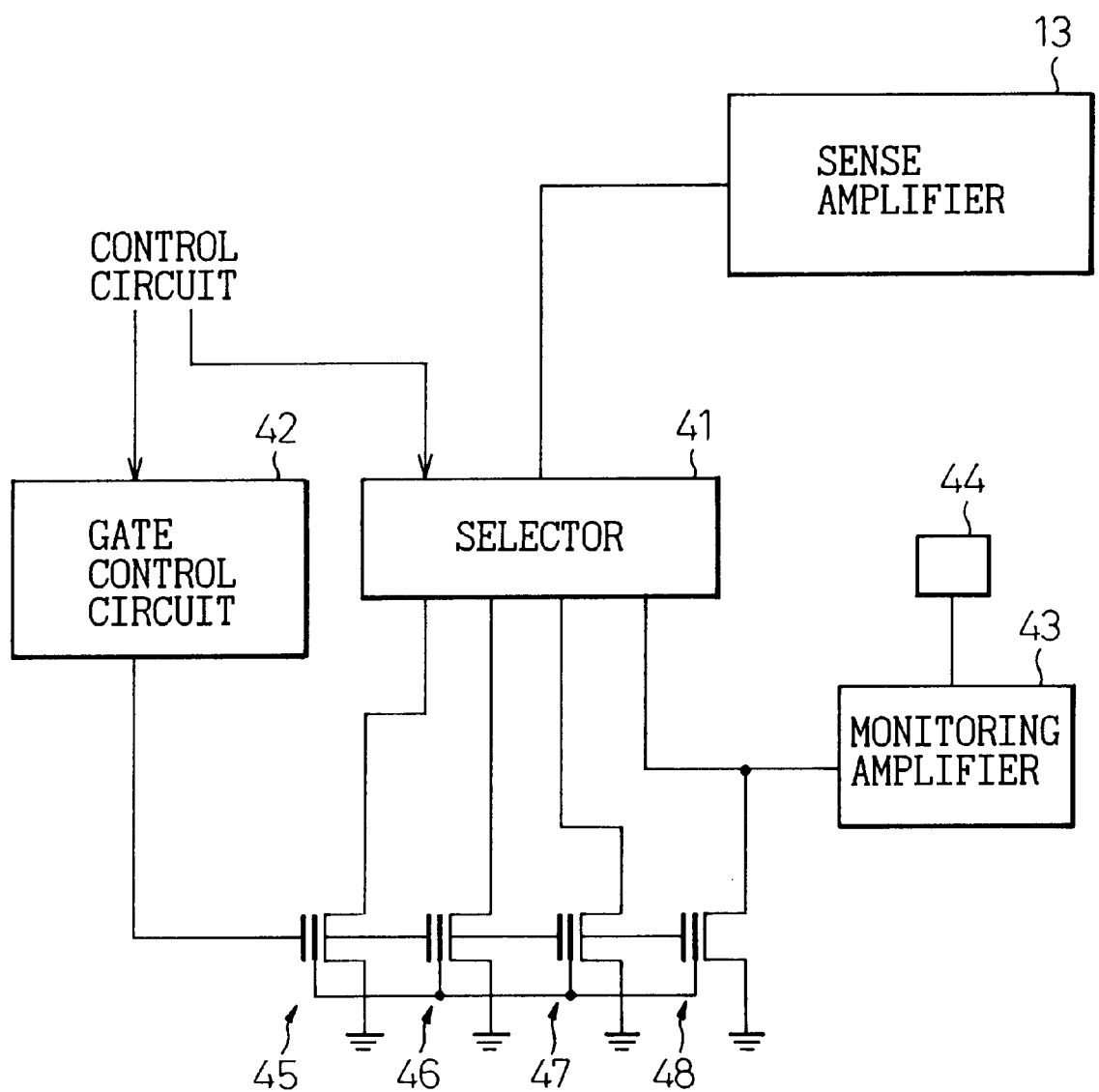
FIG. 4 is a diagram showing the basic configuration of a semiconductor integrated circuit of the present invention.

FIG. 4 is a diagram showing the basic configuration of a semiconductor integrated circuit of the present invention. As illustrated, the semiconductor integrated circuit of the present invention comprises: a sense amplifier 13; a reference circuit including a plurality of transistors 45, 46, 47, and 48 each of which has a floating gate and which generates a plurality of different signal levels each used as a reference for comparison when the sense amplifier determines a logical value; and a selector 41 for selecting any of the different signal levels generated by the reference circuit according to an object of comparison, and connecting an associated transistor to the sense amplifier. Herein, the floating gates of the plurality of transistors are connected in common. The transistors have the channel lengths, channel widths, or both of them made different so that different channel currents can be set.

When charge is injected into the floating gates, any of the channel currents of the transistors is measured. A monitoring circuit 43 is therefore included for outputting one of the signal levels of the plurality of transistors to an electrode pad 44.

Figure 5:
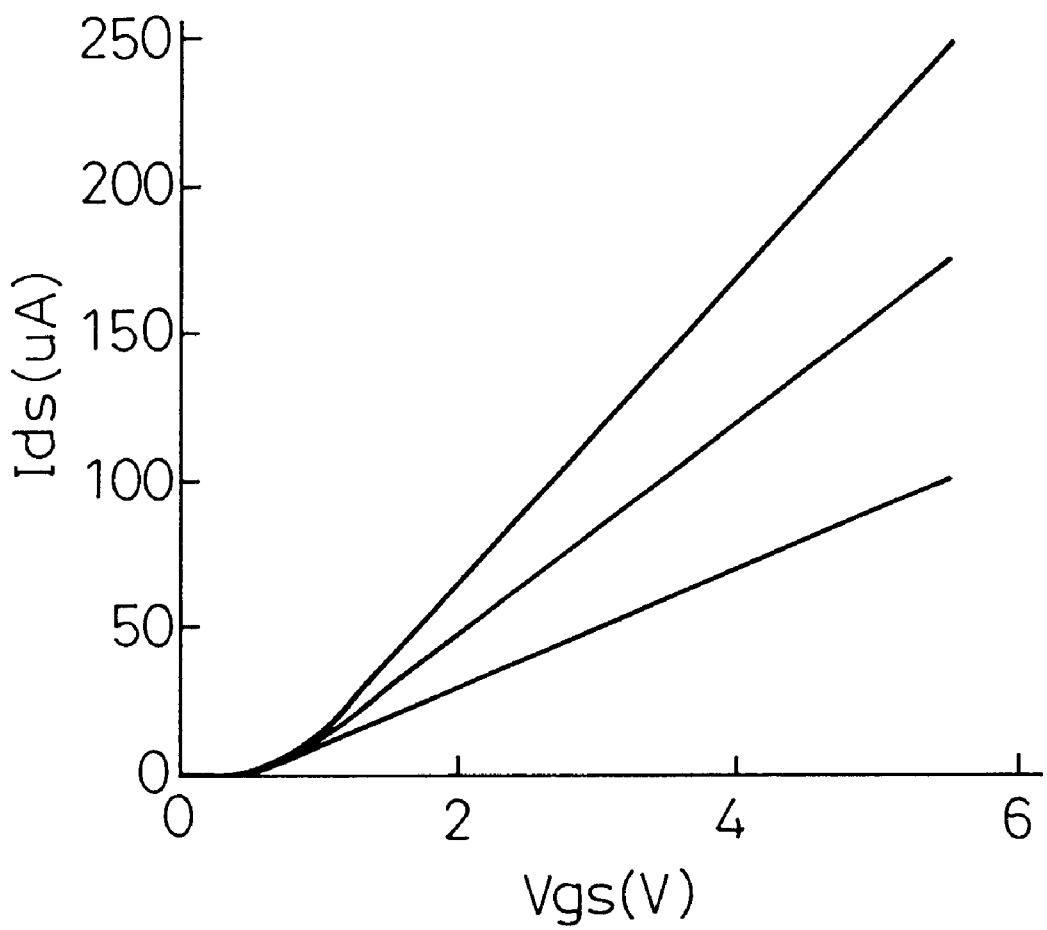
FIG. 5 is a diagram indicating that a channel current is proportional to a channel length.

FIG. 5 is a diagram showing the relationships between the gate-source voltages Vgs of three transistors having different channel lengths and having floating gates thereof connected in common, and the channel currents Ids thereof. As apparent from the drawing, the channel currents Ids of the transistors vary in proportion to the gate-source voltages Vgs thereof, while the ratio of the channel currents is retained. In the process of manufacturing, channel lengths are determined so that they exist in an accurate ratio. After the channel lengths of the transistors are determined accurately on the basis of the ratio of channel currents thereof, an error in channel currents dependent on a manufacturing process is compensated for by adjusting an amount of charge to be injected into the floating gates. Thus, the channel currents of the transistors are set accurately.

As mentioned above, in a semiconductor integrated circuit of the present invention, the ratio of channel currents of transistors serving as reference cells is set on the basis of the channel lengths of the transistors. A difference in channel currents dependent on a manufacturing process is compensated for by injecting charge into floating gates connected in common. The channel currents can therefore be set accurately. Moreover, adjustment including injection of charge into the floating gates and measurement of a channel current should merely be performed on only one transistor. At the same time, the other transistors are adjusted. The time required for testing is therefore greatly reduced. Moreover, since the adjustment including injection of charge into the floating gates and measurement of a channel current should merely be performed on one transistor, only one control circuit and one monitoring circuit are needed. This results in a saving of space. The area of a chip can therefore be reduced. The reduction in testing time and chip area leads to a reduction in manufacturing cost.

Figure 6:
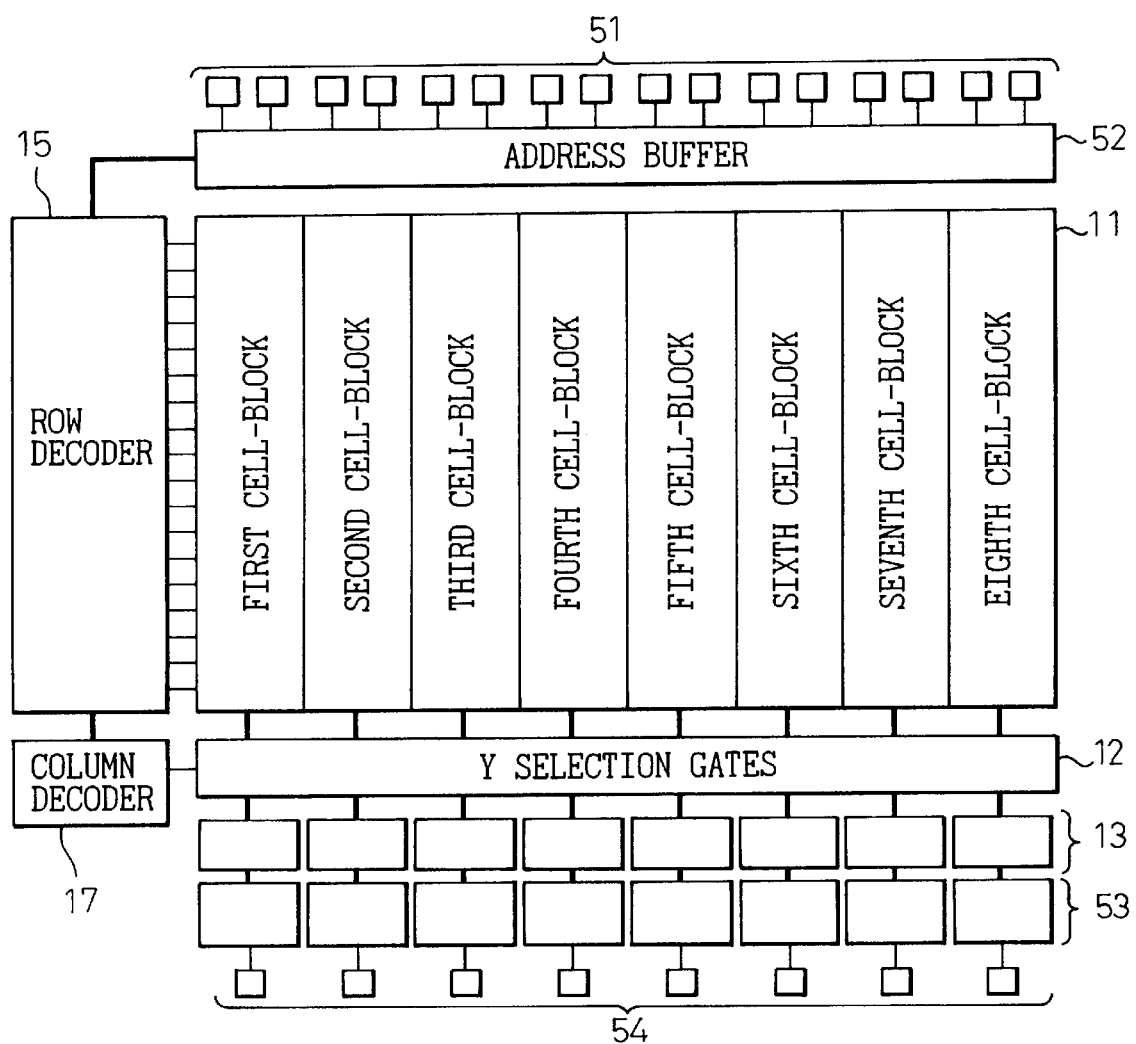
FIG. 6 is a diagram showing the configuration of a flash memory of an embodiment of the present invention.

FIG. 6 is a block diagram showing the overall configuration of a flash memory of an embodiment of the present invention, wherein an output consists of eight bits. A memory cell block 11 is therefore composed of eight cell blocks. In FIG. 6, there is shown an address input terminal 51. An address signal input through the address input terminal is fetched into a chip through an address buffer 52. Thereafter, the address signal is sent to a row decoder 15 and column decoder 17. Incidentally, other control signals are omitted. The row decoder 15 decodes a row address signal sent from the address buffer 52, and activates a word line within the memory cell block 11 to be accessed. The column decoder 17 decodes a column address signal sent from the address buffer 52, and turns ON a transistor of Y selection gates 12 that are connected with the bit lines to be accessed in relation to the cell blocks. The Y selection gates 12 are connected to sense amplifiers 13 associated with the cell blocks. An output of each sense amplifier 13 is output from an associated one of input/output buffers 54. In this embodiment, each sense amplifier 13 includes components shown in FIG. 7.

Figure 7:
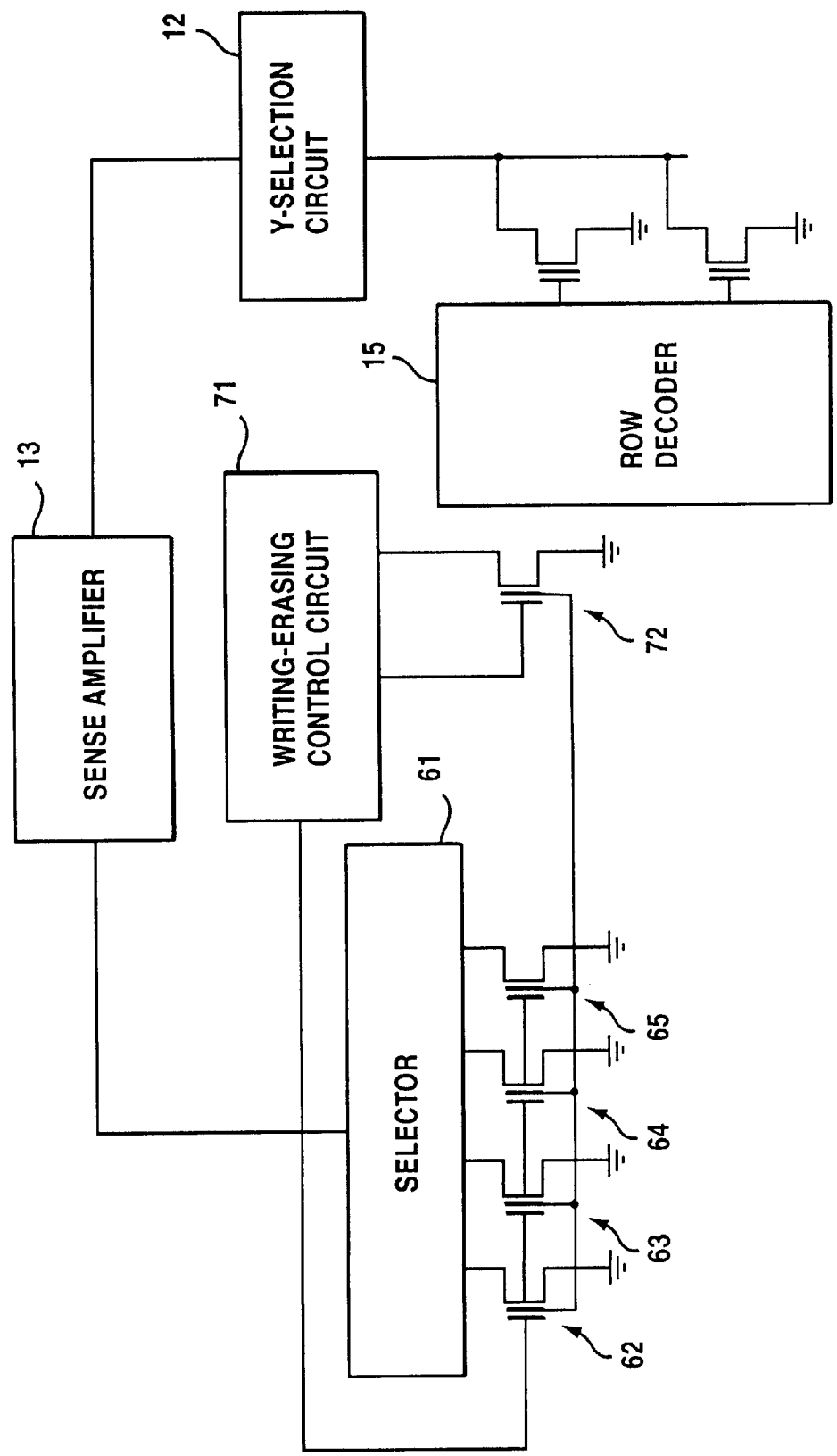
FIG. 7 is a diagram showing the configuration of a reference circuit in the embodiment of the present invention.

As shown in FIG. 7, each sense amplifier 13 is connected to a reference circuit including a selector 61, transistors 62 to 65 and 72 having floating gates connected in common, and a writing erasing control circuit 71. The transistors 62 to 65 and 72 are juxtaposed mutually adjacent. The transistors 62 to 65 have the channel lengths thereof, channel widths thereof, or both of them made different so that different channel currents can be set. The selector 61 connects any of the transistors 62 to 65 to the sense amplifier 13 according to a selection signal output from a control unit (not shown) responsible for control of the whole flash memory. The sense amplifier 13 compares the channel current of a selected transistor with the channel current of an accessed memory cell to which the sense amplifier 13 is connected via an associated Y selection gate 12, and determines and outputs a logical value.

The transistor 72 is a transistor for injecting charge into or drawing charge out of the floating gates. When the transistor 72 injects charge into or draws charge out of the floating gates, the channel currents of the transistors 62 to 65 vary. The transistor 72 achieves injection of charge into the floating gates or withdrawal of charge out of the floating gates by utilizing the writing erasing control circuit 71. The writing erasing control circuit 71 includes a monitoring amplifier for detecting a current flowing in the transistor 72 and outputting the current to an electrode pad (not shown). A given voltage is applied to the control gate and drain of the transistor 72, whereby detection of a current and injection of charge into the control gate can be carried out during a normal operation. As mentioned above, the sequence of injecting a small amount of charge into the control gate of the transistor 72 so as to allow the transistor 72 to operate normally, measuring a current flowing in the transistor 72, and then checking if the current has a given value is repeatedly carried out until the current has the given value. Normally, therefore, charge will not be drawn out of the floating gates. However, preferably, the charge should be able to be drawn out in case excessive charge is injected. In such a case, a negative voltage should be applied to the gate of the transistor 72 or a positive high voltage should be applied to the source thereof.

As described so far, according to the present invention, a plurality of reference cells having different channel currents can be realized with high precision within a small chip area. Moreover, the work of setting the channel currents can be achieved in a short period of time. Eventually, the cost of a semiconductor integrated circuit can be minimized.

What is claimed is:

1. A semiconductor integrated circuit, comprising:
   a sense amplifier,
   a reference circuit including a plurality of transistors having floating gates thereof connected in common, said transistors generating a plurality of different signal levels each used as a reference for comparison when said sense amplifier determines a logical value; and
   a selector for selecting any of different signal levels generated by said reference circuit according to an object of comparison, and connecting an associated transistor to said sense amplifier.

2. A semiconductor integrated circuit according to claim 1, wherein at least part of said plurality of transistors have different channel lengths.

3. A semiconductor integrated circuit according to claim 1, wherein at least part of said plurality of transistors have different channel widths.

4. A semiconductor integrated circuit according to claim 2, wherein at least part of said plurality of transistors have different channel widths.

5. A semiconductor integrated circuit according to claim 1, further comprising a monitoring circuit for outputting one of said signal levels of said plurality of transistors to an electrode pad.

6. A semiconductor integrated circuit according to claim 2, further comprising a monitoring circuit for outputting one of said signal levels of said plurality of transistors to an electrode pad.

7. A semiconductor integrated circuit according to claim 3, further comprising a monitoring circuit for outputting one of said signal levels of said plurality of transistors to an electrode pad.

8. A semiconductor integrated circuit according to claim 4, further comprising a monitoring circuit for outputting one of said signal levels of said plurality of transistors to an electrode pad.

9. A semiconductor integrated circuit according to claim 1, further comprising a charge adjustment transistor that has a floating gate thereof connected to said floating gates, and injects charge into or draws charge out of said floating gates.

10. A semiconductor integrated circuit according to claim 2, further comprising a charge adjustment transistor that has a floating gate thereof connected to said floating gates, and injects charge into or draws charge out of said floating gates.

11. A semiconductor integrated circuit according to claim 3, further comprising a charge adjustment transistor that has a floating gate thereof connected to said floating gates, and injects charge into or draws charge out of said floating gates.

12. A semiconductor integrated circuit according to claim 4, further comprising a charge adjustment transistor that has a floating gate thereof connected to said floating gates, and injects charge into or draws charge out of said floating gates.

13. A semiconductor integrated circuit according to claim 9, further comprising a monitoring circuit for outputting said signal level of said charge adjustment transistor to an electrode pad.

14. A semiconductor integrated circuit according to claim 10, further comprising a monitoring circuit for outputting said signal level of said charge adjustment transistor to an electrode pad.

15. A semiconductor integrated circuit according to claim 11, further comprising a monitoring circuit for outputting said signal level of said charge adjustment transistor to an electrode pad.

16. A semiconductor integrated circuit according to claim 12, further comprising a monitoring circuit for outputting said signal level of said charge adjustment transistor to an electrode pad.

* * * * *